(12) United States Patent
Miyamoto et al.

(10) Patent No.: US 8,754,462 B2
(45) Date of Patent: Jun. 17, 2014

(54) SEMICONDUCTOR DEVICE

(71) Applicants: Noboru Miyamoto, Tokyo (JP);
Yoshikazu Tsunoda, Tokyo (JP)

(72) Inventors: Noboru Miyamoto, Tokyo (JP);
Yoshikazu Tsunoda, Tokyo (JP)

(73) Assignee: Mitsubishi Electric Corporation,
Tokyo (JP)

( * ) Notice: Subject to any disclaimer, the term of this patent is extended or adjusted under 35 U.S.C. 154(b) by 0 days.

(21) Appl. No.: 13/733,723

(22) Filed: Jan. 3, 2013

(65) Prior Publication Data

US 2013/0234291 A1 Sep. 12, 2013

(30) Foreign Application Priority Data

Mar. 9, 2012 (JP) ................................. 2012-053061

(51) Int. Cl.
*H01L 29/92* (2006.01)

(52) U.S. Cl.
USPC ........... 257/307; 257/532; 257/533; 257/534; 257/535

(58) Field of Classification Search
CPC ......... H01L 29/92; H01L 23/12; H01L 23/28; H01L 21/60; H01L 23/48; H01L 25/07; H01L 25/18
USPC ......................................... 257/307, 532–535
See application file for complete search history.

(56) References Cited

U.S. PATENT DOCUMENTS

| | | | |
|---|---|---|---|
| 6,522,544 B1 | 2/2003 | Kimoto et al. | |
| 2002/0001166 A1 | 1/2002 | Kijima | |
| 2004/0017645 A1* | 1/2004 | Arai et al. | 361/302 |
| 2004/0233616 A1* | 11/2004 | Arai et al. | 361/523 |
| 2005/0127534 A1 | 6/2005 | Stecher et al. | |
| 2008/0107964 A1* | 5/2008 | Choi | 429/174 |
| 2008/0284007 A1 | 11/2008 | Horio et al. | |
| 2009/0224359 A1* | 9/2009 | Chang et al. | 257/522 |
| 2013/0279227 A1 | 10/2013 | Yoshitake et al. | |

FOREIGN PATENT DOCUMENTS

| | | |
|---|---|---|
| DE | 103 45 247 A1 | 5/2005 |
| JP | 05-299584 A | 11/1993 |
| JP | 06-140446 A | 5/1994 |
| JP | 10-174424 A | 6/1998 |

(Continued)

OTHER PUBLICATIONS

An Office Action issued by the German Patent Office on Jan. 2, 2014, which corresponds to German Patent Application No. DE 10 2012 224 354.2 and is related to U.S. Appl. No. 13/733,723 with English language translation.

*Primary Examiner* — Matthew W Such
*Assistant Examiner* — Didarul Mazumder
(74) *Attorney, Agent, or Firm* — Studebaker & Brackett PC

(57) ABSTRACT

A semiconductor device includes a first electrode electrically connected to an upper surface of a semiconductor element, a first internal electrode electrically connected to a lower surface of the semiconductor element and having a plurality of first comb finger portions and a first connection portion connecting the plurality of first comb finger portions together, a second electrode electrically connected to the first internal electrode, a second internal electrode electrically connected to a lower surface of the first electrode and having a plurality of second comb finger portions and a second connection portion connecting the plurality of second comb finger portions together, the plurality of second comb finger portions being interdigitated with but not in contact with the plurality of first comb finger portions, and a lower dielectric filling the space between the plurality of first comb finger portions and the plurality of second comb finger portions.

11 Claims, 4 Drawing Sheets

(56) References Cited

FOREIGN PATENT DOCUMENTS

| JP | 2000-092847 A | 3/2000 |
| JP | 2001-250890 A | 9/2001 |
| JP | 2001-326318 A | 11/2001 |
| JP | 2004-350400 A | 12/2004 |
| JP | 2008-288414 A | 11/2008 |
| JP | 2010-213447 A | 9/2010 |
| WO | 2012/056873 A1 | 5/2012 |

* cited by examiner

SEMICONDUCTOR DEVICE

BACKGROUND OF THE INVENTION

1. Field of the Invention

The present invention relates to a semiconductor device used, e.g., for high current control.

2. Background Art

Japanese Laid-Open Patent Publication No. 2001-250890 discloses a semi conductor device in which a semiconductor chip and a capacitor are formed on the same substrate. Japanese Laid-Open Patent Publication No. 2010-213447 discloses a power module integrated with a motor and used in automobiles.

A capacitor (or capacitors) is sometimes used to rectify the power supplied from a power supply to a semiconductor element. However, the larger the distance between the semiconductor element and the capacitor, the higher the inductance between them and hence the higher the induced surge voltage. Therefore, the semiconductor element and the rectifier capacitor are preferably spaced closely together. Further, in the case of vehicle semiconductor devices, there is a need to reduce their footprints and enhance the ease of mounting them.

For these reasons, it is necessary to minimize the sizes of such semiconductor devices (having semiconductor elements and capacitors therein). In the semiconductor device disclosed in the above Publication No 2001-250890, however, the semiconductor element and the capacitor must be mounted at predetermined spaced-apart locations on the substrate, making it impossible to reduce the distance between the semiconductor element and the capacitor. Further, in the case of the semiconductor device disclosed in the above Publication No. 2010-213447, it is necessary to improve the ease of mounting the semiconductor device, since the semiconductor elements and capacitors provided in the device are discrete components.

SUMMARY OF THE INVENTION

The present invention has been made to solve the foregoing problems. It is, therefore, an object of the present invention to provide a semiconductor device in which a semiconductor element and a capacitor are spaced closely together and which is fairly easy to mount.

The features and advantages of the present invention may be summarized as follows.

According to one aspect of the present invention, a semiconductor device includes a semiconductor element, a first electrode electrically connected to an upper surface of the semiconductor element, a first internal electrode electrically connected to a lower surface of the semiconductor element and having a plurality of first comb finger portions and a first connection portion connecting the plurality of first comb finger portions together, a second electrode electrically connected to the first internal electrode, a second internal electrode electrically connected to a lower surface of the first electrode and having a plurality of second comb finger portions and a second connection portion connecting the plurality of second comb finger portions together, the plurality of second comb finger portions being interdigitated with but not in contact with the plurality of first comb finger portions, and a lower dielectric filling the space between the plurality of first comb finger portions and the plurality of second comb finger portions.

Other and further objects, features and advantages of the invention will appear more fully from the following description.

DETAILED DESCRIPTION OF THE PREFERRED EMBODIMENTS

First Embodiment

Figure 1:
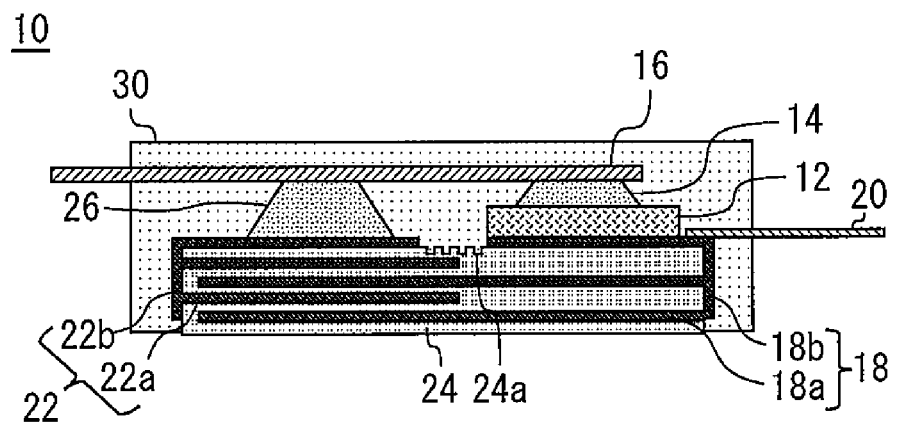
FIG. 1 is a cross-sectional view of a semiconductor device in accordance with a first embodiment of the present invention.

FIG. 1 is a cross-sectional view of a semiconductor device in accordance with a first embodiment of the present invention. The semiconductor device 10 has a semiconductor element 12. The semiconductor element 12 is an IGBT having an emitter formed on its upper surface and a collector formed on its lower surface. A first electrode 16 is electrically connected to the upper surface of the semiconductor element 12 by solder 14. The first electrode 16 functions as an emitter electrode.

A first internal electrode 18 is electrically connected to the lower surface of the semiconductor element 12. The first internal electrode 18 has a plurality of first comb finger portions 18a and a first connection portion 18b which connects the first comb finger portions 18a together. The first comb finger portions 18a extend parallel to each other. One of the first comb finger portions 18a is in surface contact with the lower surface of the semiconductor element 12.

A second electrode 20 is electrically connected to the first internal electrode 18. The second electrode 20 functions as a collector electrode. A second internal electrode 22 is formed to face the first internal electrode 18. The second internal electrode 22 has a plurality of second comb finger portions 22a and a second connection portion 22b which connects the second comb finger portions 22a together. The second comb finger portions 22a extend parallel to each other. The second comb finger portions 22a are not in contact with the first comb finger portions 18a, but are interdigitated with them.

The space between the first comb finger portions 18a and the second comb finger portions 22a is filled with a lower dielectric 24. The lower dielectric 24 is formed of ceramic. As a result, these components together form a capacitor. That is, this capacitor includes the first comb finger portions 18a and the second comb finger portions 22a, which serve as electrodes, and the lower dielectric 24 therebetween. It should be noted that the lower dielectric 24 has recessed portions 24a formed therein.

The second internal electrode 22 is electrically connected to the lower surface of the first electrode 16. Specifically, one of the second comb finger portions 22a is electrically connected to the lower surface of the first electrode 16 by solder 26. A resin 30 is so formed as to cover the semiconductor element 12, the first internal electrode 18, and the second internal electrode 22 and externally expose a portion of the first electrode 16, a portion of the second electrode 20, and a portion of the lower dielectric 24. The resin 30 is formed by means of transfer molding. The recessed portions 24a are disposed so that they are filled with the resin 30.

Figure 2:
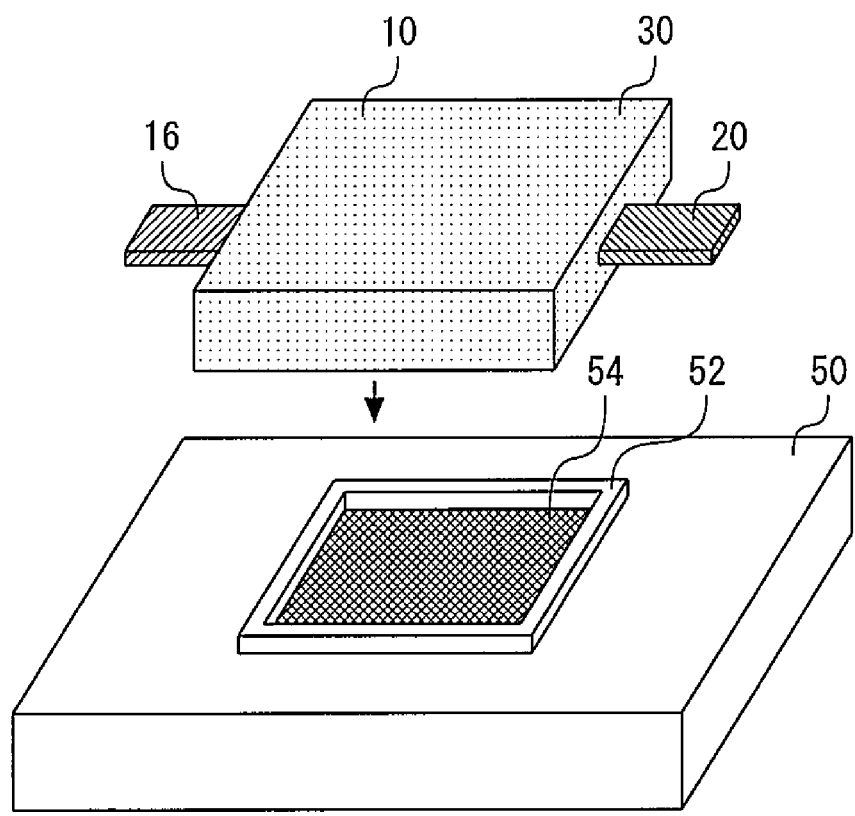
FIG. 2 is a perspective view showing an illustrative way in which the semiconductor device of the first embodiment is mounted.

FIG. 2 is a perspective view showing an illustrative way in which the semiconductor device 10 of the first embodiment is mounted. The semiconductor device 10 is secured to a cooling body 50 by a bonding material 52 on the cooling body 50. At that time, the lower surface of the lower dielectric 24 is brought into contact with a thermally conductive material 54, resulting in improved heat dissipation from the semiconductor device 10.

The lower dielectric 24 serves as an insulating film and insulates the semiconductor element 12 from the surroundings outside the semiconductor device 10. As a result, the semiconductor element 12 is insulated from the cooling body 50. Further, as described above, the lower dielectric 24 also functions as a capacitor interelectrode material. Thus, the lower dielectric 24 functions as both an insulating film for the semiconductor element 12 and the dielectric of the capacitor. Further, the semiconductor device 10 of the first embodiment is configured in such a manner that in the resin 30 the semiconductor element 12 and the capacitor are disposed adjacent to each other so that the inductance between them is low. Furthermore, the semiconductor element 12 is integrally stacked on the capacitor and encapsulated in the resin 30 by transfermolding, making it possible to reduce the footprint of the semiconductor device 10 and enhance the ease of mounting it on a cooling body, etc.

Further, by cooling the lower portion of the semiconductor device 10, it is possible to cool both the capacitor and the semiconductor element 12 concurrently. It should be noted that since the resin 30 fills the recessed portions 24a, these recessed portions 24a provide an "anchor effect" for preventing detachment of the resin 30.

Figure 3:
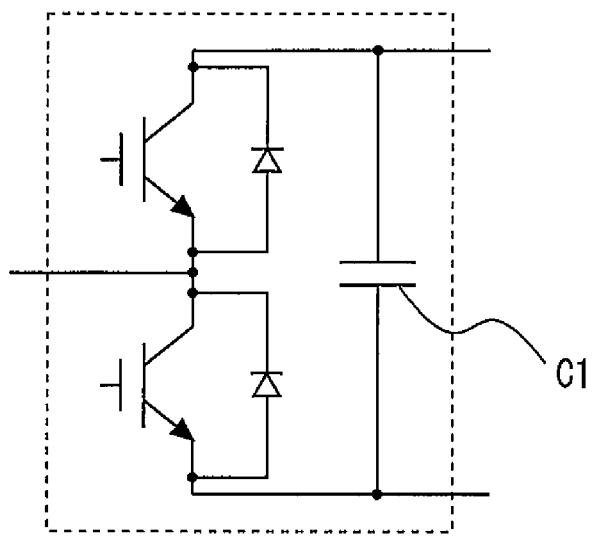
FIG. 3 is a diagram showing a half bridge circuit configured from semiconductor devices of the first embodiment.

The semiconductor device 10 of the first embodiment may be used in various applications. For example, a plurality of the semiconductor devices 10 may be connected together so as to form a bridge circuit. FIG. 3 is a diagram showing a half bridge circuit configured from semiconductor devices of the first embodiment. The capacitor formed collectively by the first internal electrodes 18, the lower dielectrics 24, and the second internal electrodes 22 of these semiconductor devices 10 may be used as a rectifier capacitor C1.

Figure 4:
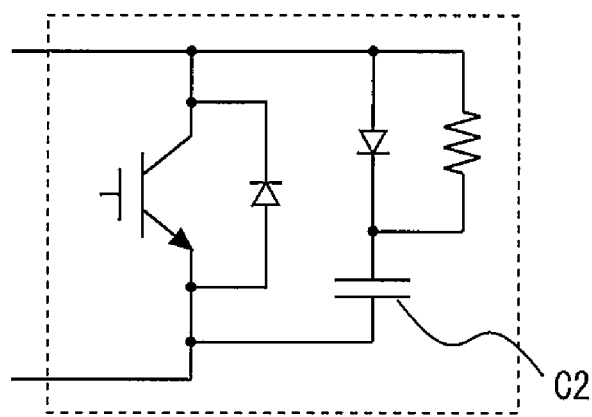
FIG. 4 is a diagram showing a CRD snubber circuit configured from the semiconductor device of the first embodiment.

Further, the semiconductor device 10 may be used to form a snubber circuit. FIG. 4 is a diagram showing a CRD snubber circuit configured from the semiconductor device of the first embodiment. The capacitor formed collectively by the first internal electrode 18, the lower dielectric 24, and the second internal electrode 24 may be used as the capacitor C2 of the snubber circuit.

The lower dielectric 24 of the semiconductor device of the first embodiment may be formed of material other than ceramic. The lower dielectric 24 may be formed of any material having the properties of both an insulator and a dielectric. For example, the lower dielectric may be formed of inorganic material other than ceramic, or formed of organic material such as a resin film.

In the semiconductor device of the first embodiment, the recessed portions 24a may be formed in the first internal electrode 18 or the second internal electrode 22, instead of or in addition to the lower dielectric 24, so that these recessed portions 24a are filled with the resin 30. The larger the area that has recessed portions formed therein, the more effectively the resin can be prevented from detachment.

Second Embodiment

Figure 5:
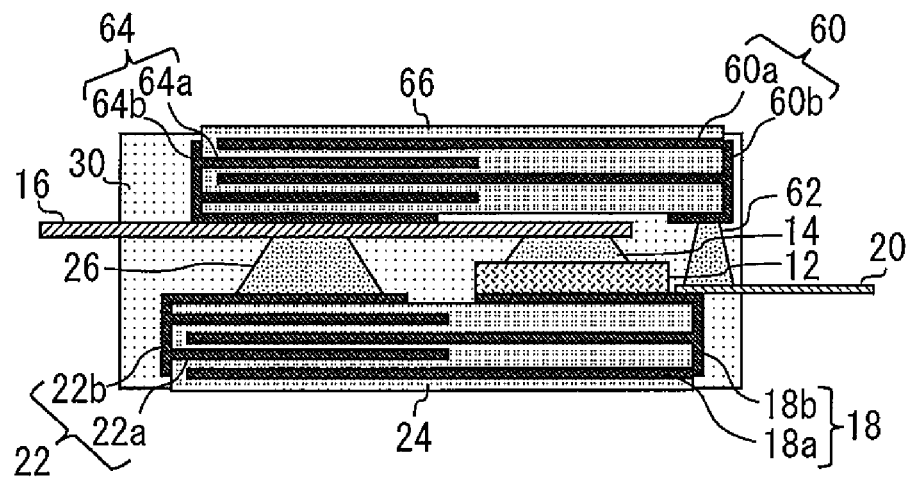
FIG. 5 is a cross-sectional view of a semiconductor device in accordance with a second embodiment of the present invention.

FIG. 5 is a cross-sectional view of a semiconductor device in accordance with a second embodiment of the present invention. The following description of the second embodiment will be primarily limited to the differences from the first embodiment. The semiconductor device of the second embodiment has a third internal electrode 60. The third internal electrode 60 has a plurality of third comb finger portions 60a and a third connection portion 60b which connects the third comb finger portions 60a together. The third internal electrode 60 is electrically connected to the second electrode 20 by solder 62. Specifically, one of the third comb finger portions 60a is connected to the upper surface of the second electrode 20 through the solder 62. It should be noted that the third internal electrode 60 is formed on the upper side of the semiconductor element 12.

A fourth internal electrode 64 is formed to face the third internal electrode 60. The fourth internal electrode 64 has a plurality of fourth comb finger portions 64a which are not in contact with the third comb finger portions 60a but are interdigitated with them. The fourth internal electrode 64 also has a fourth connection portion 64b which connects the fourth comb finger portions 64a together. The fourth internal electrode 64 is electrically connected to the upper surface of the first electrode 16. Specifically, one of the fourth comb finger portions 64a is in surface contact with the upper surface of the first electrode 16.

Further, the space between the third comb finger portions 60a and the fourth comb finger portions 64a is filled with an upper dielectric 66. As a result, these components together form a capacitor. That is, this capacitor includes the third comb finger portions 60a and the fourth finger comb portions 64a, which serve as electrodes, and the upper dielectric 66 therebetween.

The resin 30 covers the semiconductor element 12, the first internal electrode 18, the second internal electrode 22, the third internal electrode 60, and the fourth internal electrode 64 and externally exposes a portion of the first electrode 16, a portion of the second electrode 20, a portion of the lower dielectric 24, and a portion of the upper dielectric 66.

In the semiconductor device of the second embodiment, the lower dielectric 24 and the upper dielectric 66 are exposed at the lower and upper surfaces, respectively, of the semiconductor device, so that both the lower and upper surfaces of the semiconductor device can be externally cooled. Further, since a capacitor is formed both above and below the semiconductor element 12, it is possible to vary the capacitance between the first electrode 16 and the second electrode 20 over a wider range than in the first embodiment.

It should be noted that the semiconductor device of the second embodiment is susceptible of alterations at least similar to those that can be made to the semiconductor device the first embodiment, and also susceptible of use in applications at least similar to those where the semiconductor device of the first embodiment can be used. For example, the lower dielectric 24 and the upper dielectric 66 may be formed of a resin film.

Third Embodiment

Figure 6:
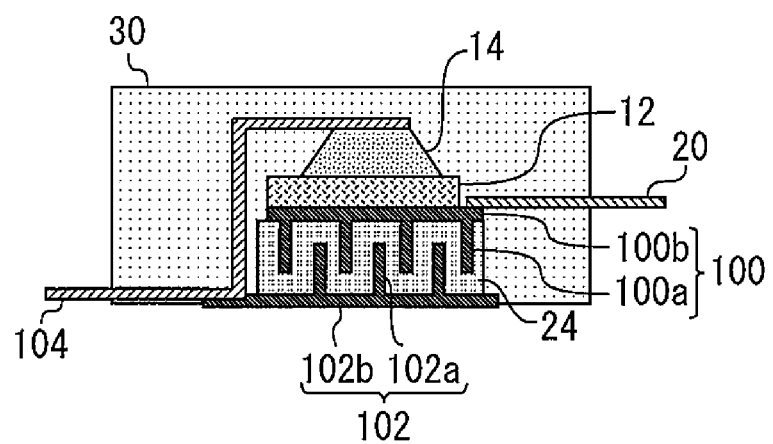
FIG. 6 is a cross-sectional view of a semiconductor device in accordance with a third embodiment of the present invention.

FIG. 6 is a cross-sectional view of a semiconductor device in accordance with a third embodiment of the present invention. The following description of the third embodiment will be primarily limited to the differences from the first embodiment. A first internal electrode 100 and a second internal electrode 102 vertically face each other. Specifically, a first connection portion 100b of the first internal electrode 100 is in surface contact with the lower surface of the semiconductor element 12. Further, a plurality of first comb finger portions 100a extend downward from the first connection portion 100b. The upper surface of a second connection portion 102b of the second internal electrode 102 faces the first connection portion 100b. Further, a plurality of second comb finger portions 102a extend upward from the second connection portion 102b.

A first electrode 104 is electrically connected to the upper surface of the semiconductor element 12 by solder 14 and is bent into contact with the upper surface of the second connection portion 102b. The resin 30 is so formed as to cover the semiconductor element 12 and the first internal electrode 100 and expose a portion of the first electrode 104, a portion of the second electrode 20, and the lower surface of the second connection portion 102b.

Thus, in the semiconductor device of the third embodiment, the first comb finger portions 100a extend downward from the first connection portion 100b, the second comb finger portions 102a extend upward from the second connection portion 102b, and the lower surface of the second connection portion 102b is externally exposed. Therefore, the heat generated from the semiconductor element 12 can be rapidly transferred out of the semiconductor device, resulting in improved heat dissipation from the semiconductor device. It should be noted that the semiconductor device of the third embodiment is susceptible of alterations at least similar to those that can be made to the semiconductor device of the first embodiment, and also susceptible of use in applications at least similar to those where the semiconductor device of the first embodiment can be used.

Fourth Embodiment

Figure 7:
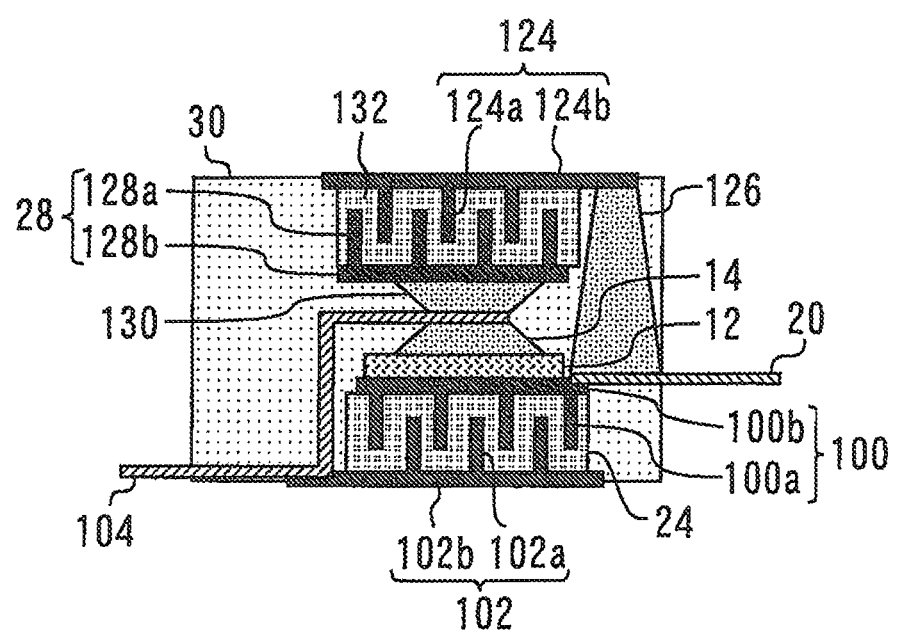
FIG. 7 is a cross-sectional view of a semiconductor device in accordance with a fourth embodiment of the present invention.

FIG. 7 is a cross-sectional view of a semiconductor device in accordance with a fourth embodiment of the present invention. The following description of the fourth embodiment will be primarily limited to the differences from the third embodiment. The semiconductor device of the fourth embodiment has a third internal electrode 124. The third internal electrode 124 has a plurality of third comb finger portions 124a and a third connection portion 124b which connects the third comb finger portions 124a together. The third internal electrode 124 is electrically connected to the upper surface of the second electrode 20 by solder 126. This third internal electrode 124 is formed on the upper side of the semiconductor element 12.

A fourth internal electrode 128 is formed to face the third internal electrode 124. The fourth internal electrode 128 has a plurality of fourth comb finger portions 128a which are not in contact with the third comb finger portions 124a but are interdigitated with them. The fourth internal electrode 128 also has a fourth connection portion 128b which connects the fourth comb finger portions 128a together. The fourth internal electrode 128 is electrically connected to the upper surface of the first electrode 104 by solder 130. Specifically, the lower surface of the fourth connection portion 128b is electrically connected to the upper surface of the first electrode 104 by the solder 130.

The space between the third comb finger portions 124a and the fourth comb finger portions 128a is filled with an upper dielectric 132. As a result, these components together form a capacitor. That is, this capacitor includes the third comb finger portions 124a and the fourth comb finger portions 128a, which serve as electrodes, and the upper dielectric 132 therebetween.

The resin 30 covers the semiconductor element 12, the first internal electrode 100, and the fourth internal electrode 128 and externally exposes a portion of the first electrode 104, a portion of the second electrode 20, the lower surface of the second connection portion 102b, and the upper surface of the third connection portion 124b.

Thus, the semiconductor device of the fourth embodiment is configured by providing a capacitor above the semiconductor element in the semiconductor device of the third embodiment. Therefore, it is possible to externally cool both the lower and upper surfaces of the semiconductor device of the fourth embodiment. The third internal electrode 124 and the fourth internal electrode 128, which are disposed above the semiconductor element, are configured as follows: The fourth comb finger portions 128a extend upward from the fourth connection portion 128b, the lower surface of the third connection portion 124b faces the fourth connection portion 128b, and the third comb finger portions 124a extend downward from the third connection portion 124b. This configuration facilitates the heat dissipation from the semiconductor device.

Further, since a capacitor is formed both above and below the semiconductor element 12, it is possible to vary the capacitance between the first electrode 104 and the second electrode 20 over a wider range than in the third embodiment. It should be noted that the semiconductor device of the fourth embodiment is susceptible of alterations at least similar to those that can be made to the semiconductor devices of the first and third embodiments, and also susceptible of use in applications at least similar to those where the semiconductor devices of the first and third embodiments can be used.

The present invention makes it possible to provide a semiconductor device in which a semiconductor element and a capacitor are spaced closely together and which is fairly easy to mount.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-053061, filed on Mar. 9, 2012 including specification, claims, drawings and summary, on which the Convention priority of the present application is based, are incorporated herein by reference in its entirety.

What is claimed is:

1. A semiconductor device comprising:
   a semiconductor element;
   a first electrode electrically connected to an upper surface of said semiconductor element;
   a first internal electrode electrically connected to a lower surface of said semiconductor element and having a plurality of first comb finger portions and a first connection portion connecting said plurality of first comb finger portions together;
   a second electrode electrically connected to said first internal electrode;
   a second internal electrode electrically connected to a lower surface of said first electrode and having a plurality of second comb finger portions and a second connection portion connecting said plurality of second comb finger portions together, said plurality of second comb finger portions being interdigitated with but not in contact with said plurality of first comb finger portions; and
   a lower dielectric filling the space between said plurality of first comb finger portions and said plurality of second comb finger portions.

2. The semiconductor device according to claim 1, further comprising a resin covering said semiconductor element and said first and second internal electrodes and externally exposing a portion of said first electrode, a portion of said second electrode, and a portion of said lower dielectric,
   wherein one of said plurality of first comb finger portions is in surface contact with said lower surface of said semiconductor element.

3. The semiconductor device according to claim 1, further comprising:
   a third internal electrode electrically connected to said second electrode and having a plurality of third comb finger portions and a third connection portion connecting said plurality of third comb finger portions together, said third internal electrode being formed on the upper side of said semiconductor element;
   a fourth internal electrode electrically connected to an upper surface of said first electrode and having a plurality of fourth comb finger portions and a fourth connection portion connecting said plurality of fourth comb finger portions together, said plurality of fourth comb finger portions being interdigitated with but not in contact with said plurality of third comb finger portions; and
   an upper dielectric filling the space between said plurality of third comb finger portions and said plurality of fourth comb finger portions.

4. The semiconductor device according to claim 1, further comprising a resin covering said semiconductor element and said first, second, third, and fourth internal electrodes and externally exposing a portion of said first electrode, a portion of said second electrode, a portion of said lower dielectric, and a portion of said upper dielectric.

5. The semiconductor device according to claim 1, further comprising a resin covering said semiconductor element and said first internal electrode and externally exposing a portion of said first electrode and a portion of said second electrode, wherein:
   said first connection portion is in surface contact with said lower surface of said semiconductor element;
   said plurality of first comb finger portions extend downward from said first connection portion;
   an upper surface of said second connection portion faces said first connection portion; and
   said resin externally exposes a lower surface of said second connection portion.

6. The semiconductor device according to claim 3, further comprising a resin covering said semiconductor element and said first and fourth internal electrodes and externally exposing a portion of said first electrode and a portion of said second electrode, wherein:
   said first connection portion is in surface contact with said lower surface of said semiconductor element;
   said plurality of first comb finger portions extend downward from said first connection portion;
   an upper surface of said second connection portion faces said first connection portion;
   a lower surface of said fourth connection portion faces and is electrically connected to said upper surface of said first electrode;
   said plurality of fourth comb finger portions extend upward from said fourth connection portion;
   a lower surface of said third connection portion faces said fourth connection portion; and
   said resin externally exposes a lower surface of said second connection portion and an upper surface of said third connection portion.

7. The semiconductor device according to claim 1, wherein said lower dielectric is formed of a resin film or ceramic.

8. The semiconductor device according to claim 3, wherein said lower and upper dielectrics are formed of a resin film or ceramic.

9. The semiconductor device according to claim 1, wherein the capacitor formed collectively by said first internal electrode, said lower dielectric, and said second internal electrode is used as a rectifier capacitor.

10. The semiconductor device according to claim 1, wherein the capacitor formed collectively by said first internal electrode, said lower dielectric, and said second internal electrode is used as a capacitor for a snubber circuit.

11. The semiconductor device according to claim 1, wherein said lower dielectric, said first internal electrode, or said second internal electrode has a recessed portion disposed so that said recessed portion is filled with said resin.

* * * * *